United States Patent
Okuno

(10) Patent No.: US 10,930,336 B1
(45) Date of Patent: Feb. 23, 2021

(54) MEMORY DEVICE AND ROW-HAMMER REFRESH METHOD THEREOF

(71) Applicant: Winbond Electronics Corp., Taichung (TW)

(72) Inventor: Shinya Okuno, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/528,607

(22) Filed: Jul. 31, 2019

(51) Int. Cl.
*G11C 11/406* (2006.01)
*G11C 11/408* (2006.01)

(52) U.S. Cl.
CPC .... *G11C 11/40603* (2013.01); *G11C 11/4085* (2013.01)

(58) Field of Classification Search
CPC ............ G11C 11/40603; G11C 11/4085
See application file for complete search history.

(56) References Cited

U.S. PATENT DOCUMENTS

| | | | |
|---|---|---|---|
| 9,190,139 B2 | 11/2015 | Jung et al. | |
| 9,478,316 B1 | 10/2016 | Ryu | |
| 9,799,391 B1 | 10/2017 | Wei | |
| 10,410,710 B2 * | 9/2019 | Lee | G11C 29/76 |
| 10,490,250 B1 * | 11/2019 | Ito | G11C 11/40611 |
| 2014/0003173 A1 | 1/2014 | Ku | |
| 2017/0287544 A1 * | 10/2017 | Hedden | G11C 11/406 |
| 2018/0158507 A1 * | 6/2018 | Bang | G11C 11/40611 |
| 2019/0237132 A1 * | 8/2019 | Morohashi | G11C 11/40611 |

FOREIGN PATENT DOCUMENTS

| | | |
|---|---|---|
| KR | 20160011483 | 2/2016 |
| KR | 20170083466 | 7/2017 |
| TW | 201837910 | 10/2018 |

OTHER PUBLICATIONS

"Office Action of Taiwan Counterpart Application", dated Mar. 20, 2020, p. 1-p. 10.
"Office Action of Taiwan Counterpart Application", dated Dec. 23, 2019, pp. 1-6.
"Office Action of Korea Counterpart Application" with English translation thereof, dated Jul. 14, 2020, p. 1-p. 9.

\* cited by examiner

*Primary Examiner* — Gene N Auduong
(74) *Attorney, Agent, or Firm* — JCIPRNET

(57) ABSTRACT

A memory device and a row-hammer refresh method thereof are provided. The memory device includes a memory array and a controller. The memory array includes a plurality of normal areas and a redundancy area adjacent to the plurality of normal areas. The redundancy area includes a plurality of first word lines and a plurality of second word lines which are alternately arranged. The controller is configured to row-hammer refresh the plurality of normal areas without row-hammer refreshing the redundancy area.

10 Claims, 4 Drawing Sheets

MEMORY DEVICE AND ROW-HAMMER REFRESH METHOD THEREOF

BACKGROUND OF THE INVENTION

Field of the Invention

The disclosure relates to a memory device and a row-hammer refresh method thereof, and more particularly, to a memory device and a row-hammer refresh method thereof which do not need to frequently row-hammer refresh word lines in a redundancy area due to the row hammer phenomenon.

Description of Related Art

When a specific word line in a dynamic random access memory (DRAM) is repeatedly turned on multiple times, the memory cells on the word lines adjacent to the specific word line may lose the stored data due to the cross talk or coupling effect. This interference phenomenon is referred to as the row hammer phenomenon.

To address the row hammer phenomenon, the conventional technique row-hammer refreshes the repeatedly turned-on word line (also referred to as an aggressor word line) to protect the adjacent word lines (also referred to as victim word lines) from the row hammer phenomenon. However, in some DRAM structures having a high memory cell density, it is complicated to calculate the word line addresses of the victim word lines, so a row-hammer address calculator having a larger area is required to calculate the word line addresses of the victim word lines.

SUMMARY OF THE INVENTION

The invention provides a memory device and a row-hammer refresh method thereof, in which word lines for separation are added to a redundancy area to reduce the area of the row-hammer address calculator. Moreover, it is not necessary to frequently row-hammer refresh the word lines of the redundancy area, which thereby reduces the row-hammer refresh current.

An embodiment of the invention provides a memory device. The memory device includes a memory array and a controller. The memory array has a plurality of normal areas and a redundancy area adjacent to the normal areas. The redundancy area includes a plurality of first word lines and a plurality of second word lines which are alternately arranged. The controller is coupled to the memory array. The controller is configured to row-hammer refresh the normal areas without row-hammer refreshing the redundancy area.

An embodiment of the invention provides a row-hammer refresh method adapted for a memory device. The memory device includes a memory array and a controller, and the memory array has a plurality of normal areas and a redundancy area adjacent to the normal areas. The redundancy area includes a plurality of first word lines and a plurality of second word lines which are alternately arranged, and a quantity of the first word lines is a first quantity. The controller is configured to row-hammer refresh the normal areas and the redundancy area. The row-hammer refresh method includes, but not limited to, the following steps. A quantity of word lines enabled in the redundancy area is calculated. The quantity of the word lines enabled in the redundancy area is compared with the first quantity. When the quantity of the word lines enabled in the redundancy area is greater than the first quantity, the first word lines and the second word lines are row-hammer refreshed. When the quantity of the word lines enabled in the redundancy area is less than or equal to the first quantity, the first word lines and the second word lines are not row-hammer refreshed.

Based on the above, in some embodiments of the invention, the memory device and the row-hammer refresh method thereof can reduce the area of the row-hammer address calculator. Word lines for separation are added to the redundancy area to reduce the layout area of the row-hammer address calculator. Moreover, in the invention, since it is not necessary to frequently row-hammer refresh the word lines of the redundancy area, the row-hammer refresh current can be further reduced.

To make the aforementioned more comprehensible, several embodiments accompanied with drawings are described in detail as follows.

DESCRIPTION OF THE EMBODIMENTS

Figure 1:
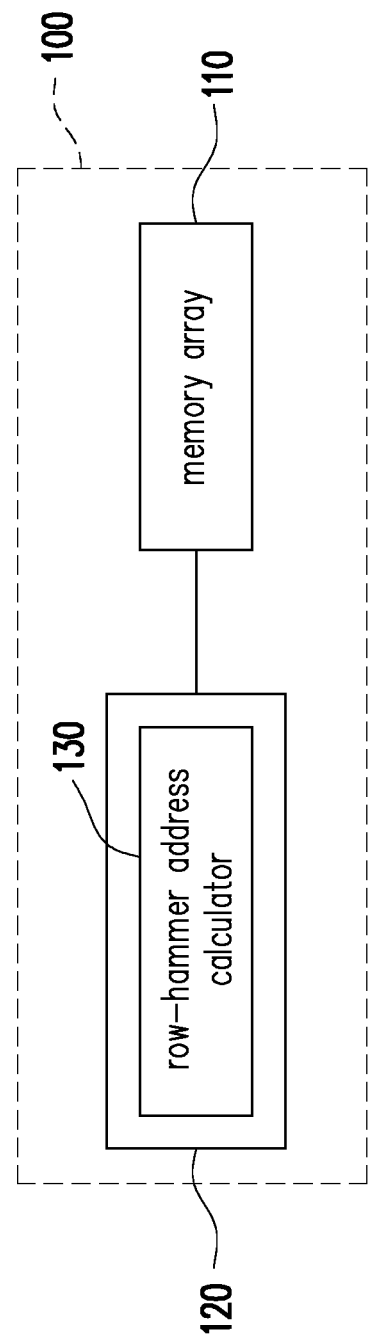
FIG. 1 is a schematic view showing a memory device according to an embodiment of the invention.

FIG. 1 is a schematic view showing a memory device according to an embodiment of the invention. Referring to FIG. 1, a memory device 100 includes a memory array 110 and a controller 120. The memory array 110 includes a plurality of word lines and a plurality of memory cells (not shown) and is configured to store data. The invention does not limit the architecture of the memory array. The controller 120 is coupled to the memory array 110, and the controller 120 is configured to access, verify, and row-hammer refresh the memory array 110. The invention does not limit the architecture of the controller. The controller 120 includes a row-hammer address calculator 130. The row-hammer address calculator 130 is configured to calculate a word line address in the memory array 110 that is expected to be affected by the row hammer phenomenon and needs row-hammer refreshing. The controller 120 row-hammer refreshes the word line in the memory array 110 based on the word line address to prevent the memory cells on the word line from losing the stored data.

Figure 2:
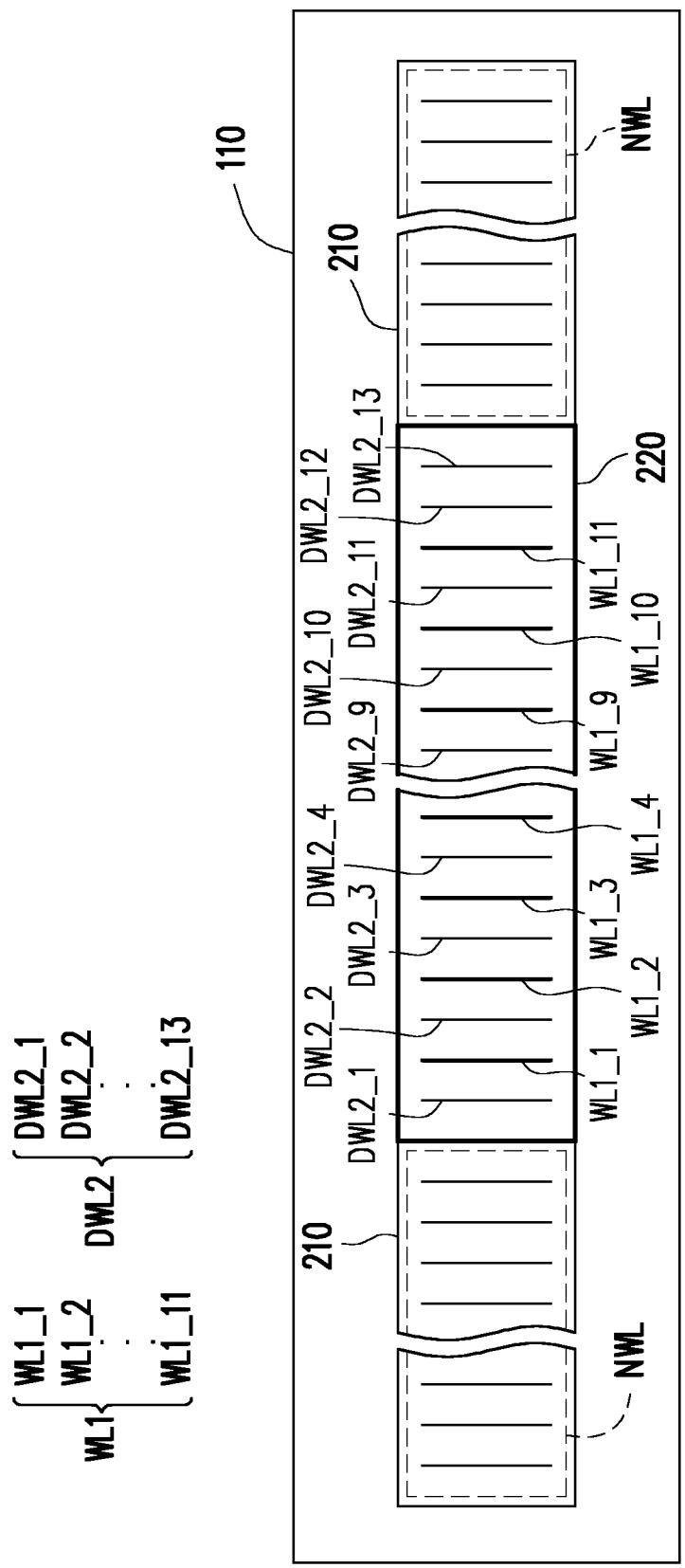
FIG. 2 is a schematic view showing a layout of word lines in a memory array according to an embodiment of the invention.

FIG. 2 is a schematic view showing a layout of word lines in a memory array according to an embodiment of the invention. Referring to FIG. 2, the memory array 110 has a normal area 210 and a redundancy area 220 adjacent to the normal area 210. In an embodiment, the normal area 210 is adjacent to two sides of the redundancy area 220, but the invention is not limited thereto. The normal area 210 includes a plurality of normal word lines NWL and normal memory cells (not shown). The redundancy area 220 includes a plurality of first word lines WL1, a plurality of second word lines DWL2, and redundancy memory cells (not shown). The plurality of first word lines WL1 and the plurality of second word lines DWL2 are alternately arranged. In an embodiment, the second word lines DWL2 are redundant.

In an embodiment, the quantity of the first word lines WL1 is a first quantity, the quantity of the second word lines DWL2 is a second quantity, and the second quantity is greater than the first quantity. It is noted that since the plurality of second word lines DWL2 separate the plurality of first word lines WL1, the plurality of first word lines WL1 are not adjacent to each other. Moreover, in the redundancy area 220, the word lines adjacent to the boundary between the redundancy area 220 and the normal area 210 are the second word lines DWL2. In an embodiment, the controller 120 is configured to row-hammer refresh the normal area 210 without row-hammer refreshing the redundancy area 220.

For example, in an embodiment, the plurality of first word lines WL1 include first word lines WL1_1 to WL1_11, the plurality of second word lines DWL2 include second word lines DWL2_1 to DWL2_13. The quantities of the first word lines WL1 and the second word lines DWL2 are only illustrated for the convenience of description of the embodiment, and the quantities are determined by the actual requirements and are not limited in the invention. The first word line WL1_1 is located between the second word lines DWL2_1 and DWL2_2, the first word line WL1_2 is located between the second word lines DWL2_2 and DWL2_3, and so on. Namely, the second word lines DWL2_1 to DWL2_13 are arranged such that the first word lines WL1_1 to WL1_11 are not adjacent to each other. Moreover, the word line at the left boundary in the redundancy area 220 is the second word line DWL2_1, and the word line at the right boundary in the redundancy area 220 is the second word line DWL2_13. In an embodiment, since the second word lines DWL2_1 to DWL2_13 are redundant (i.e., the second word lines DWL2_1 to DWL2_13 do not need to be turned on), the second word lines DWL2_1 to DWL2_13 can separate the row hammer between the first word lines WL1_1 to WL1_11 and the row hammer to the normal area 210, so that it is not necessary to consider the row hammer issue of the first word lines WL1_1 to WL1_11 in the redundancy area 220. Accordingly, in this embodiment, the row-hammer address calculator 130 in the controller 120 does not need to calculate the word line address that requires row-hammer refreshing in the redundancy area 220, but only needs to calculate the word line address that requires row-hammer refreshing in the normal area 210, to enable the controller 120 to row-hammer refresh the word line of the normal area 210 to prevent the row hammer issue in the normal area 210. Since it is not necessary to calculate the word line address that requires row-hammer refreshing in the redundancy area 220 and it is not necessary to frequently row-hammer refresh the redundancy area 220, it is possible to save the layout area of the row-hammer address calculator 130 originally provided for the redundancy area 220 and reduce the row-hammer refresh current thereof.

In a common operation, the controller 120 accesses and row-hammer refreshes the normal memory cells through the plurality of normal word lines NWL. In an embodiment, when the controller 120 determines that any one of the plurality of normal word lines NWL is invalid, the controller 120 disables the invalid normal word line and enables one of the plurality of first word lines WL1 to replace the invalid normal word line. For example, when the controller 120 performs data verification and determines that one of the plurality of normal word lines NWL is invalid, the controller turns off the invalid normal word line to prohibit access and turns on the first word line WL1_1 to replace the invalid normal word line.

Figure 3:
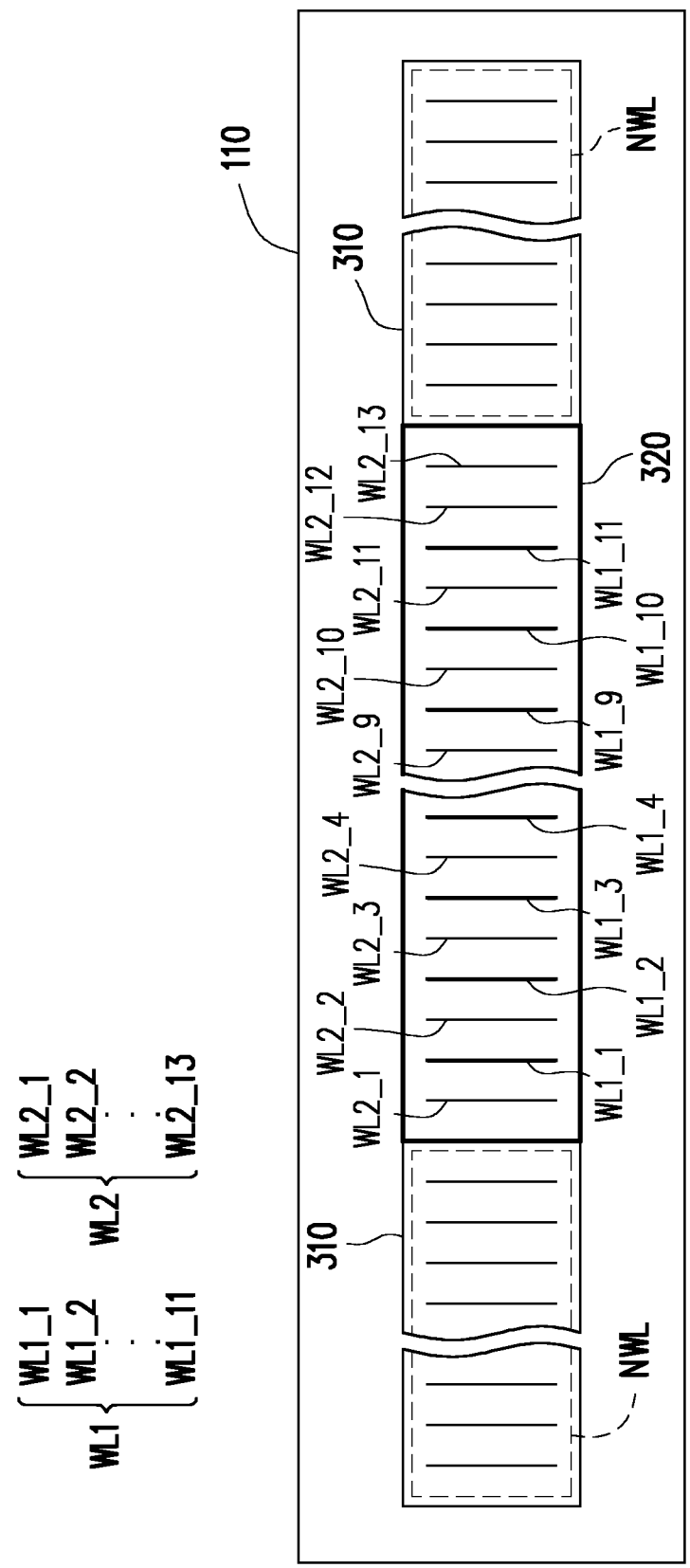
FIG. 3 is a schematic view showing a layout of word lines in a memory array according to another embodiment of the invention.

FIG. 3 is a schematic view showing a layout of word lines in a memory array according to another embodiment of the invention. Referring to FIG. 3, the memory array 110 has a normal area 310 and a redundancy area 320 adjacent to the normal area 310. In another embodiment, the normal area 310 is adjacent to two sides of the redundancy area 320, but the invention is not limited thereto. The normal area 310 includes a plurality of normal word lines NWL and normal memory cells (not shown). The redundancy area 320 includes a plurality of first word lines WL1, a plurality of second word lines WL2, and redundancy memory cells (not shown). The plurality of first word lines WL1 and the plurality of second word lines WL2 are alternately arranged. In another embodiment, the second word lines WL2 are not redundant.

In another embodiment, the redundancy area 320 may include a non-volatile memory, a laser fuse, or an anti-fuse, but the invention is not limited thereto.

In another embodiment, the quantity of the first word lines WL1 is a first quantity, the quantity of the second word lines WL2 is a second quantity, and the second quantity is greater than the first quantity. It is noted that since the plurality of second word lines WL2 separate the plurality of first word lines WL1, the plurality of first word lines WL1 are not adjacent to each other. Moreover, in the redundancy area 320, the word lines adjacent to the boundary between the redundancy area 320 and the normal area 310 are the second word lines WL2. In another embodiment, the controller 120 is configured to row-hammer refresh the normal area 310 and the redundancy area 320.

For example, in another embodiment, the plurality of first word lines WL1 include first word lines WL1_1 to WL1_11, and the plurality of second word lines WL2 include second word lines WL2_1 to WL2_13. The quantities of the first word lines WL1 and the second word lines WL2 are only illustrated for the convenience of description of the embodiment, and the quantities are determined by the actual requirements and are not limited in the invention. The first word line WL1_1 is located between the second word lines WL2_1 and WL2_2, the first word line WL1_2 is located between the second word lines WL2_2 and WL2_3, and so on. Namely, the second word lines WL2_1 to WL2_13 are arranged such that the first word lines WL1_1 to WL1_11 are not adjacent to each other. Moreover, the word line at the left boundary in the redundancy area 320 is the second word line WL2_1, and the word line at the right boundary in the redundancy area 320 is the second word line WL2_13. In another embodiment, since the second word lines WL2_1 to WL2_13 are not redundant (i.e., the second word lines WL2_1 to WL2_13 need to be turned on by the controller 120), it is necessary to consider the row hammer issue between the first word lines WL1_1 to WL1_11 and the second word lines WL2_1 to WL2_13 in the redundancy area 320. Therefore, in another embodiment, in addition to calculating the word line address that requires row-hammer refreshing in the normal area 310, the row-hammer address calculator 130 of the controller 120 also needs to calculate the word line address that requires row-hammer refreshing in the redundancy area 320, to enable the controller 120 to row-hammer refresh the word line of the normal area 310 and the redundancy area 320 to prevent the row hammer issue.

In another embodiment, when the controller 120 determines that any one of the plurality of normal word lines NWL is invalid, the controller 120 disables the invalid normal word line NWL and enables one of the plurality of first word lines WL1 or the plurality of second word lines WL2 to replace the invalid normal word line NWL. In another embodiment, the priority for the controller 120 to enable the plurality of first word lines WL1 is higher than the plurality of second word lines WL2. When the controller 120 determines that the quantity of the word lines enabled in the redundancy area 320 is less than or equal to the total quantity (i.e., the first quantity) of the first word lines, the controller 120 does not row-hammer refresh the first word lines WL1 and the second word lines WL2. When the controller 120 determines that the quantity of the word lines enabled in the redundancy area 320 is greater than the quantity (i.e., the first quantity) of the first word lines, the controller 120 row-hammer refreshes the first word lines WL1 and the second word lines WL2.

For example, in another embodiment, when the controller 120 performs data verification and determines that one of the plurality of normal word lines NWL is invalid, the controller 120 turns off the invalid normal word line (not shown) to forbid access, and prioritizingly turns on one of the first word lines WL1_1 to WL1_11 (e.g., turning on the first word line WL1_1) to replace the invalid normal word line. When the controller 120 determines that the next normal word line is invalid, the controller 120 may turn on the first word line WL1_2 to replace the next invalid normal word line, and so on. When the controller 120 determines that the next normal word line is invalid and all the first word lines WL1_1 to WL1_11 in the redundancy area 320 are turned on, the controller 120 may turn on the second word line WL2_1. After the controller 120 turns on the second word line WL2_1, when the controller 120 determines that the next normal word line is invalid and all the first word lines WL1_1 to WL1_11 in the redundancy area 320 are turned on, the controller 120 may turn on the second word line WL2_2, and so on.

In another embodiment, when the controller 120 determines that the quantity of the word lines enabled in the redundancy area 320 is less than or equal to the total quantity (i.e., the first quantity) of the first word lines (e.g., when only the first word line WL1_1 and the first word line WL1_2 in the first word lines WL1 are enabled, the quantity of the enabled word lines is 2, which is less than or equal to the total quantity (i.e., 11) of the first word lines WL1), since the first word line WL1_1 and the first word line WL1_2 which are enabled in the redundancy area 320 are separated by the second word line WL2_2 which is not turned on, it is not necessary to consider the row hammer issue. Therefore, the controller 120 does not need to row-hammer refresh the first word lines WL1_1 to WL1_11 and the second word lines WL2_1 to WL2_13 in the redundancy area 320.

In another embodiment, when the controller 120 determines that the quantity of the word lines enabled in the redundancy area 320 is greater than the total quantity (i.e., the first quantity) of the first word lines (e.g., when the first word lines WL1_1 to WL1_11 and the second word lines WL2_1 to WL2_2 are all enabled, the quantity of the enabled word lines is 13, which is greater than the total quantity (i.e., 11) of the first word lines WL1), since the first word lines WL1_1 to WL1_2 and the second word lines WL2_1 to WL2_2 in the redundancy area 320 are all enabled and are adjacent to each other, and the enablement of the second word line WL2_1 also affects the word line of the left normal area, it is necessary to consider the row hammer issue. Therefore, in another embodiment, the controller 120 needs to row-hammer refresh the first word lines WL1_1 to WL1_2 and the second word lines WL2_1 to WL2_2 in the redundancy area 320, or row-hammer refresh all the first word lines WL1_1 to WL1_11 and the second word lines WL2_1 to WL2_13 in the redundancy area 320. The row-hammer refreshing strategy is determined according to the design requirements, and the invention is not limited thereto. Accordingly, in another embodiment, the row-hammer address calculator 130 of the controller 120 needs to calculate the word line address that requires row-hammer refreshing in the normal area 310 and the redundancy area 320, to enable the controller 120 to row-hammer refresh the word line of the normal area 310 and the redundancy area 320 to prevent the row hammer issue. In another embodiment, since it is still necessary to calculate the word line address that requires row-hammer refreshing in the redundancy area 320, the layout area in the row-hammer address calculator 130 originally provided for the redundancy area 320 cannot be saved, but the row-hammer refresh current can still be reduced.

Figure 4:
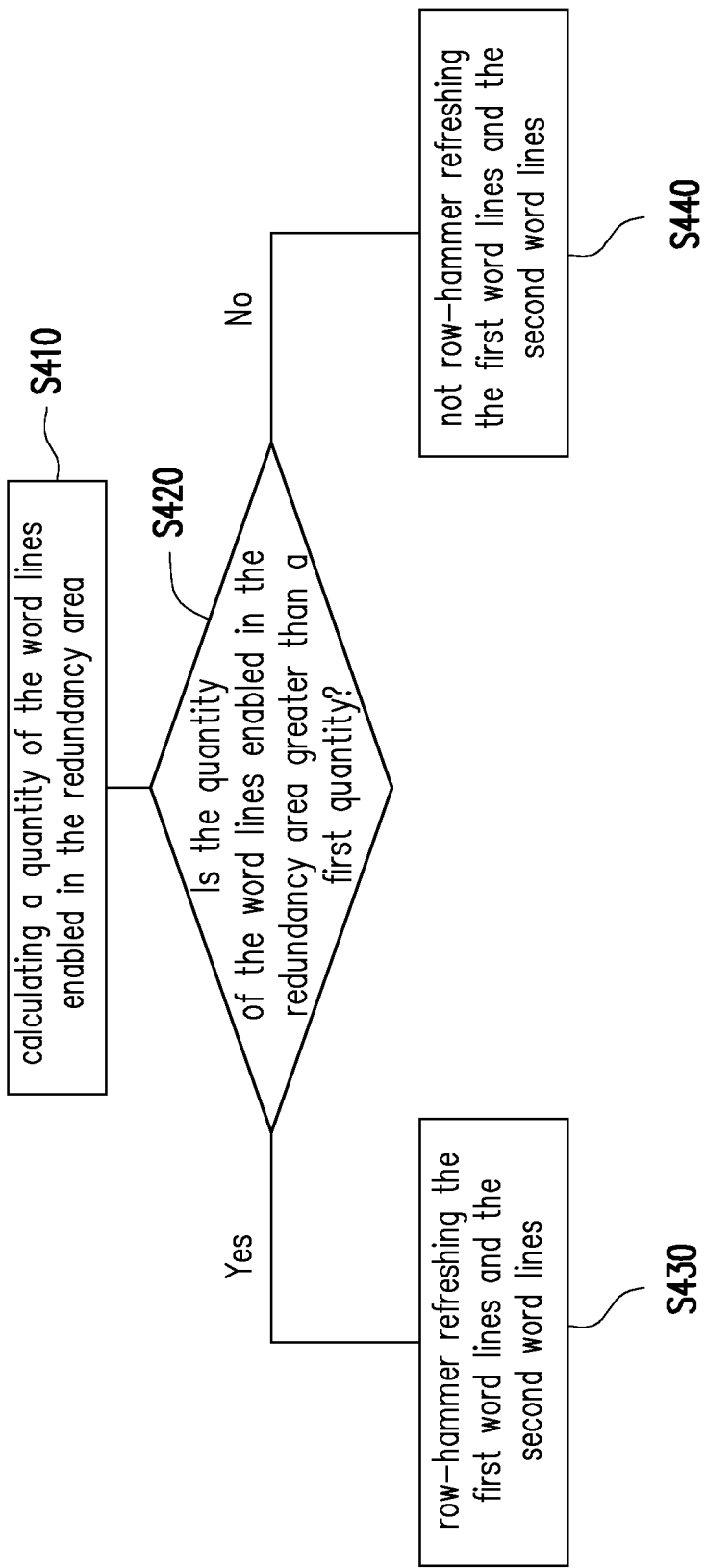
FIG. 4 is a flowchart showing a row-hammer refresh method according to an embodiment of the invention.

FIG. 4 is a flowchart showing a row-hammer refresh method according to an embodiment of the invention. In step S410, the controller calculates a quantity of the word lines enabled in the redundancy area. Next, in step S420, the controller compares the quantity of the word lines enabled in the redundancy area with a first quantity. When the quantity of the word lines enabled in the redundancy area is greater than the first quantity, step S430 is performed. When the quantity of the word lines enabled in the redundancy area is less than or equal to the first quantity, step S440 is performed. In step S430, when the quantity of the word lines enabled in the redundancy area is greater than the first quantity, the controller row-hammer refreshes the first word lines and the second word lines. In step S440, when the quantity of the word lines enabled in the redundancy area is less than or equal to the first quantity, the controller does not row-hammer refresh the first word lines and the second word lines.

In summary of the above, in some embodiments of the invention, the memory device and the row-hammer refresh method thereof can reduce the area of the row-hammer address calculator. Word lines for separation are added to the redundancy area to protect the redundancy area from the row hammer phenomenon, so that it is not necessary to calculate the word line address with row hammer in the redundancy area, and thereby the layout area of the row-hammer address calculator can be reduced. Moreover, in the invention, since it is not necessary to frequently row-hammer refresh the word lines of the redundancy area, the row-hammer refresh current can be further reduced. On the other hand, in the invention, the word lines for separation may be further enabled, and the row-hammer refreshing approach may be adjusted according to the quantity of the word lines enabled in the redundancy area, to reduce the row-hammer refresh current.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device comprising:
   a memory array, having a plurality of normal areas and a redundancy area adjacent to the normal areas, wherein the redundancy area comprises a plurality of first word lines and a plurality of second word lines which are alternately arranged; and
   a controller, coupled to the memory array, wherein the controller is configured to row-hammer refresh the normal areas without row-hammer refreshing the redundancy area regardless of a quantity of word lines enabled in the redundancy area.

2. The memory device according to claim 1, wherein the first word lines are not adjacent to each other, and the second word lines are redundant.

3. The memory device according to claim 1, wherein the controller comprises a row-hammer address calculator, and the row-hammer address calculator is configured to calculate a word line address that requires row-hammer refreshing in the normal areas.

4. The memory device according to claim 1, wherein the normal areas comprise a plurality of normal word lines, wherein when the controller determines that a first normal word line in the normal word lines is invalid, the controller disables the first normal word line and enables one of the first word lines.

5. The memory device according to claim 1, wherein the controller comprises a row-hammer address calculator, and the row-hammer address calculator is configured to calculate a word line address that requires row-hammer refreshing in the normal areas and the redundancy area to enable the controller to row-hammer refresh the normal areas and the redundancy area.

6. The memory device according to claim 1, wherein the normal areas comprise a plurality of normal word lines, wherein when the controller determines that data of a first normal word line in the nonoral word lines is invalid, the controller disables the first normal word line and enables one of the first word lines or one of the second word lines.

7. The memory device according to claim 6, wherein a priority for the controller to enable the first word lines is higher than the second word lines.

8. The memory device according to claim 1, wherein quantities of the first word lines and the second word lines are respectively a first quantity and a second quantity, and the second quantity is greater than the first quantity.

9. The memory device according to claim 8, wherein when the controller determines that the quantity of word lines enabled in the redundancy area is greater than the first quantity, the controller row-hammer refreshes the first word lines and the second word lines, and when the controller determines that the quantity of the word lines enabled in the redundancy area is less than or equal to the first quantity, the controller does not row-hammer refresh the first word lines and the second word lines.

10. A row-hammer refresh method adapted for a memory device, wherein the memory device comprises a memory array and a controller, the memory array has a plurality of normal areas and a redundancy area adjacent to the normal areas, the redundancy area comprises a plurality of first word lines and a plurality of second word lines which are alternately arranged, a quantity of the first word lines is a first quantity, and the controller is configured to row-hammer refresh the normal areas and the redundancy area, the row-hammer refresh method comprising:

calculating a quantity of word lines enabled in the redundancy area;

comparing the quantity of the word lines enabled in the redundancy area with the first quantity;

when the quantity of the word lines enabled in the redundancy area is greater than the first quantity, row-hammer refreshing the first word lines and the second word lines; and when the quantity of the word lines enabled in the redundancy area is less than or equal to the first quantity, not row-hammer refreshing the first word lines and the second word lines.

* * * * *